United States Patent
Louvel et al.

(10) Patent No.: US 6,262,898 B1
(45) Date of Patent: Jul. 17, 2001

(54) CIRCUIT FOR DRIVING A SWITCHING TRANSISTOR

(75) Inventors: Jean-Paul Louvel; Michael Meltzner, both of Villingen-Schwenningen (DE)

(73) Assignee: Deutsche Thomson-Brandt GmbH (DE)

( * ) Notice: Subject to any disclaimer, the term of this patent is extended or adjusted under 35 U.S.C. 154(b) by 0 days.

(21) Appl. No.: 09/406,653

(22) Filed: Sep. 27, 1999

(51) Int. Cl.[7] .......................... H02M 3/335; H02M 7/538
(52) U.S. Cl. ................................. 363/24; 363/133
(58) Field of Search .......................... 363/16, 20, 21.01, 363/21.04, 21.12, 24, 25, 56.01, 56.09, 56.12, 97, 131, 133, 134

(56) References Cited

U.S. PATENT DOCUMENTS

| 4,713,561 | 12/1987 | Yamada . | |
|---|---|---|---|
| 4,755,741 | 7/1988 | Nelson . | |
| 4,987,362 | 1/1991 | Zwanziger . | |
| 5,703,764 | * 12/1997 | Hermann et al. | 363/21 |
| 6,166,927 | * 12/2000 | Farrington et al. | 363/25 |
| 6,191,960 | * 12/2000 | Fraidlin et al. | 363/25 |

FOREIGN PATENT DOCUMENTS

| 0114540 | 1/1984 | (EP) . |
|---|---|---|
| 0504559 | 9/1992 | (EP) . |

OTHER PUBLICATIONS

Search Report for PCT Appln. No. PCT/EP99/00360.

* cited by examiner

*Primary Examiner*—Matthew Nguyen
(74) *Attorney, Agent, or Firm*—Joseph S. Tripoli; Joseph J. Laks; Joseph J. Kolodka

(57) ABSTRACT

Circuits for driving a switching transistor (T3) with a driver stage (T2, T4, T5, L1), as are used for example in horizontal deflection stages of television sets or computer monitors, are known in a wide variety of embodiments. The invention specifies a power-efficient and cost-effective circuit of this type which contains a comparator circuit (T1), which monitors the voltage (UC) across the current input of the switching transistor (T3) for the purpose of monitoring saturation by comparing the said voltage with a reference voltage (UR), thereby effecting regulation. The comparator circuit may be realized, e.g. by a simple transistor circuit (T1), the reference voltage (UR) being applied to the control input of the said transistor circuit, the current input of the said transistor circuit being connected to the drive signal (US) of the driver stage, and the current output of the said transistor circuit being connected to the voltage (UC) via the current input of the switching transistor (T3).

6 Claims, 1 Drawing Sheet

CIRCUIT FOR DRIVING A SWITCHING TRANSISTOR

BACKGROUND OF THE INVENTION

1. Field of the Invention

The invention is based on a circuit for driving a switching transistor with a driver stage. A circuit of this type is disclosed for example in DE-A-43 17 154 and is used in particular in horizontal line deflection circuits for television sets and computer monitors.

2. Description of the Related Art

Switching transistors used for this purpose must be driven with a defined current in order to keep the power demand and the losses of the driver stage low. Moreover, the switching transistor ought not to be operated at saturation since it then impairs the switching behaviour of the switching transistor as a result of high recombination times of electrons and electrons-holes in the transistor. Furthermore, the switching transistor ought, in each case in the shortest possible time, both to be turned off and to be turned on into a volume resistance which is as small as possible, in order to minimize the losses in the switching transistor. These partly conflicting requirements should be fulfilled as optimally as possible by a circuit for driving a switching transistor.

BRIEF SUMMARY OF THE INVENTION

The invention is based on the object of specifying a power-efficient circuit of this type for driving a switching transistor, which circuit is also cost-effective.

This object is achieved by means of the features of the invention as specified in claim 1. Advantageous developments of the invention are specified in the sub-claims.

The circuit for driving a switching transistor according to the invention contains a comparator circuit, which monitors the voltage across the current input of the switching transistor and compares it with a reference voltage for the purpose of monitoring saturation of the switching transistor. Since this voltage is a measure of the saturation of the switching transistor and is likewise a measure of the losses of the said transistor, efficient regulation is made possible by the comparator circuit.

The voltage across the current input, the collector in the case of an npn switching transistor, can be tapped by means of a diode, for example. Since this voltage is very high at the switch-off instant of the switching transistor and is typically 1500 V in the case of deflection stages in television sets, in this case it is also possible for a plurality of diodes to be connected in series, as a result of which their voltage loading is reduced. The diode is advantageously connected via a resistor to an operating voltage, with the result that a defined current flows through this diode in the turned-on phase of the switching transistor and, as a result of this, there is a defined voltage drop across the said diode. This voltage is added to the collector voltage to form a voltage which can be utilized as a regulating signal. The comparator circuit is used to effect regulation to a constant collector voltage of the switching transistor when the latter is turned on.

The comparator circuit used may be, for example, a transistor which is connected by its terminals to the driver stage, the reference voltage and the voltage across the current input of the switching transistor. The reference voltage may be derived at an operating voltage, for example with the aid of a voltage divider.

Whereas individual properties of the switching transistor and loading through the output side are not taken into account by the circuit of DE 43 17 154, the circuit of the invention corrects variations in the transistor parameters or changes in the collector current due, for example, to varying picture brightnesses in a television set as well as temperature influences. Thus, for example, the base current demand may vary by as much as a factor of two as a result of the variation in the current gain of switching transistors. If the base current for the switching transistor is not currently adjusted, the losses in the switching transistor or in the driver stage will rise.

By virtue of the regulation by way of the saturation of the switching transistor, the base current is regulated to a value at which both the conduction losses in the switching transistor and the switch-on and -off losses due to transistor capacitances are low both in the event of fluctuating collector currents and in the event of variations in the current gain ($h_{FE}$) and in the event of temperature effects.

BRIEF DESCRIPTION OF THE DRAWINGS

The invention is explained in more detail below using an exemplary embodiment. The drawing shows.

DETAILED DESCRIPTION OF THE INVENTION

Figure 1:
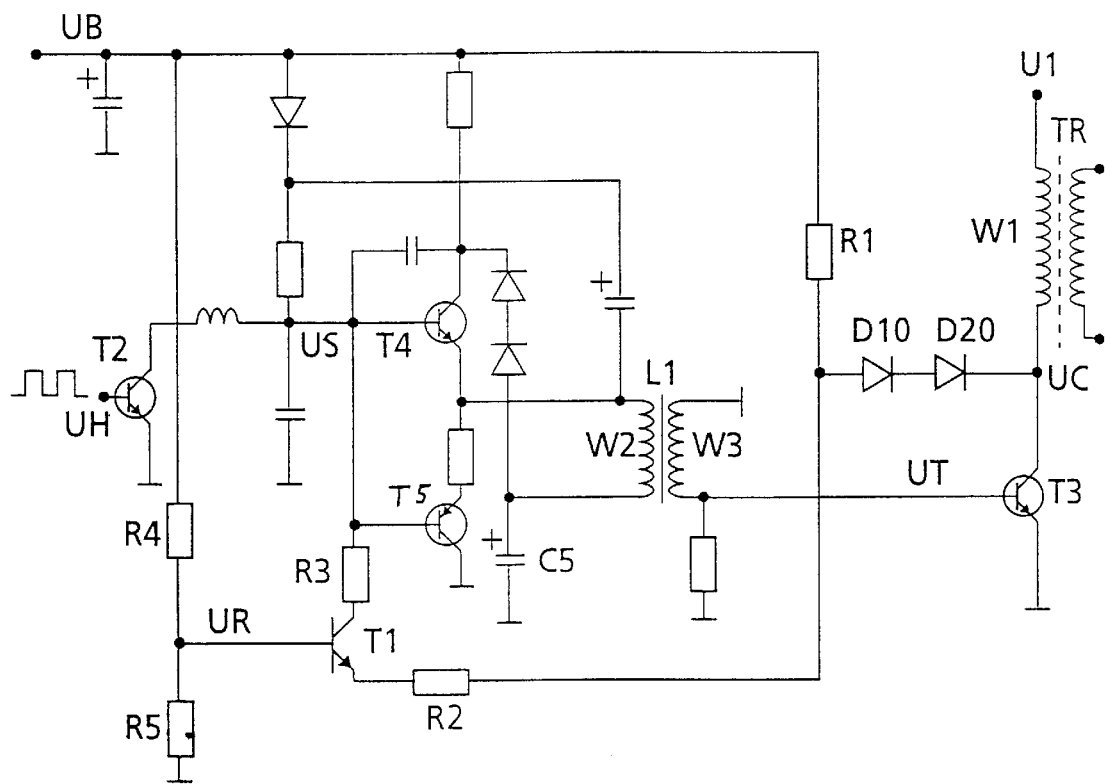
FIG. 1 illustrates a circuit for driving a switching transistor with a transistor stage as comparator circuit for monitoring saturation of the switching transistor.

The Figure illustrates a circuit for driving a switching transistor T3 which is preferably used for deflection circuits in television sets. By means of a transformer Tr, to whose primary-side winding W1 the switching transistor T3 is connected, the high voltage and further supply voltages are generated and also the horizontal deflection in the picture tube is controlled. In the driver stage, a synchronization signal UH for the switching transistor T3 is conditioned in that the said signal is further amplified by means of a first transistor stage T2, in which it is amplified into a drive signal US and inverted, and a downstream transistor stage containing transistors T4 and T5, which operate in push-pull mode, and is subsequently passed via a driver transformer L1 to the control input of the switching transistor T3. In this exemplary embodiment, the switching transistor T3 of this circuit is an npn transistor and the driver stage is supplied with a positive operating voltage UB. However, the invention is not restricted to this type of switching transistor.

The driver circuit functions as follows: the switching transistor T3, to which a positive voltage U1 is applied via the primary winding W1, is turned on by positive drive signals and off by negative drive signals. The output of the push-pull transistor stage T4, T5 is switched through alternately to the positive operating voltage UB and to earth by the drive signals US, as a result of which positive pulses are generated with a low output impedance, which pulses are converted into positive and negative control signals for the switching transistor T3 by the driver transformer L1. In this case, the driver transformer L1 is connected to the output of the push-pull transistor stage T4, T5 by one end of the input-side winding W2 and to a capacitor C5 by the other end, which capacitor is positively charged by the positive signals. The output-side winding W3 of the driver transformer L1 is connected in an inverted manner, with the result that a negative output current is generated by a positive input current. If the output of the transistor stage T4, T5 goes to low potential, then the input-side winding W2 of the driver transformer L1 reverses polarity on account of the positively charged capacitor C5, and thus so, too, does the output-side winding W3, as a result of which the switching transistor T3 is turned on.

For the purpose of monitoring saturation of the switching transistor T3, the circuit contains a comparator circuit with a transistor stage T1, which monitors the voltage UC across a current input of the switching transistor, across the collector in this exemplary embodiment. In order to tap the collector voltage UC, two diodes D10, D20 are connected in series and are connected to the operating voltage UB via a resistor R1, the said diodes being biased in such a way that a current flows through them when the switching transistor T3 is turned on. The current in this case is predetermined by the resistor R1, with the result that a defined voltage drop is produced across the diodes D10 and D20. This voltage drop is added to the collector voltage UC of the switching transistor T3 and is tapped by the transistor stage T1 via the emitter terminal thereof and a resistor R2. In the case of a switching transistor T3 used in the exemplary embodiment, the set saturation voltage UC across the collector is approximately 1.5 V.

The high voltage produced during the turn-off of the switching transistor T3 as a result of the inductance of the winding W1 is blocked by the diodes D10, D20. Since this voltage is typically 1500 V in the deflection stage of a television set, two diodes D10 and D20 are connected in series in this case, as a result of which the requirements made of the withstand voltage of the diodes are less stringent.

The transistor T1 connected as a comparator is connected by its control input to a voltage divider which provides a reference voltage UR via two resistors R4 and R5, which are connected to the operating voltage UB; its current input, the collector in this exemplary embodiment, is connected via a resistor R3 to the control signal US of the push-pull transistor stage T4, T5. In this case, the reference voltage UR is essentially constant, or fluctuations in the operating voltage UB are included in the regulation. The control signal US is loaded to a greater or lesser extent by the transistor stage T1; if, for example, the voltage UC across the collector of the switching transistor T3 is excessively low because the latter is driven excessively greatly, then a larger current flows through the transistor stage T1, with the result that the control signal US is more severely loaded and decreases. Consequently, the current in the transformer W2 decreases and thus so, too, does the base current of the switching transistor T3, with the result that the collector voltage UC rises again. If the collector voltage UC is excessively high, on the other hand, then the current flowing through the transistor T1 becomes smaller, with the result that the control voltage US rises and, consequently, drives the switching transistor T3 to a higher level.

The reference voltage UR generated by the voltage divider R4, R5 must be set, therefore, such that the desired collector voltage is generated. In this case, the transistor T4 is operated in the linear mode. Its power loss is not increased, however, as a result of this, compared with the switched mode, since its collector current is smaller.

When the switching transistor T3 is turned off, the comparator circuit has no function since the drive signal US is at low potential in this case, as a result of which the transistor stage T1 is in the off state. The resistors R2, R3 are chosen in such a way that oscillations are suppressed when the transistor stage T1 is turned on.

What is important for this comparator circuit is that the switching transistor T3 is turned off by a positive drive signal US, with the result that the transistor T1 is in the on state as a function of the reference voltage UR and the voltage UC across the collector of the switching transistor T3, and the drive signal US can thus be regulated. This is ensured by the previously described circuitry of the driver transformer L1. However, other embodiments thereof likewise lie within the scope of the invention. The comparator circuit affords power-efficient control both of the driver stage and of the switching transistor which, with the use of one transistor stage, requires only a small number of components.

What is claimed is:

1. A circuit for driving a switching transistor comprising a driver stage with a push-pull transistor stage, at least one diode, coupled with a first terminal to a current input of said switching transistor and coupled with the second terminal via a resistor to an operating voltage, for tapping the voltage across the current input of the switching transistor, a comparator circuit with a transistor, which is coupled with its current input to the input of said driver stage, with its current output with said second terminal of said diode and with its control input with a reference voltage for comparing the voltage across the current input of said switching transistor with said reference voltage with the purpose of monitoring and regulating of the saturation of said switching transistor.

2. The circuit according to claim 1, wherein said reference voltage is either constant or is derived from an operating voltage via a voltage divider.

3. The circuit according to claim 2, wherein the saturation of the switching transistor is set using the voltage of said voltage divider.

4. The circuit according to claim 1, wherein at least one resistor is arranged in the current path of said transistor for the purpose of oscillation suppression.

5. The circuit according to claim 1, wherein the driver stage comprises a driver transformer which is coupled between the output of said push-pull transistor stage and the control input of said switching transistor.

6. A deflection circuit comprising a transformer with a primary winding, a switching transistor coupled in series to said primary winding, a driver stage for said switching transistor comprising a push-pull transistor stage, at least one diode, coupled with a first terminal to a current input of said switching transistor and coupled with the second terminal via a resistor to an operating voltage, for tapping the voltage across the current input of the switching transistor, a comparator circuit with a transistor, which is coupled with its current input to the input of said driver stage, with its current output to said second terminal of said diode and with its control input to a reference voltage with the purpose of monitoring of the saturation of said switching transistor, and for a regulation to a constant collector voltage of said switching transistor during the conduction phase.

* * * * *